(12) United States Patent
Burns et al.

(10) Patent No.: US 6,608,763 B1
(45) Date of Patent: Aug. 19, 2003

(54) STACKING SYSTEM AND METHOD

(75) Inventors: Carmen D. Burns; James G. Wilder; Julian Dowden, all of Austin, TX (US)

(73) Assignee: Staktek Group L.P., Austin, TX (US)

( * ) Notice: Subject to any disclaimer, the term of this patent is extended or adjusted under 35 U.S.C. 154(b) by 251 days.

(21) Appl. No.: 09/663,753

(22) Filed: Sep. 15, 2000

(51) Int. Cl.[7] .............................................. H01R 12/16
(52) U.S. Cl. ...................... 361/790; 257/686; 439/109
(58) Field of Search .............................. 361/790, 784, 361/735, 742, 804; 257/684–685, 686, 723, 724–726; 438/109

(56) References Cited

U.S. PATENT DOCUMENTS

| | | | |
|---|---|---|---|
| 3,246,386 A | 4/1966 | Ende | |
| 3,287,606 A | 11/1966 | Schwartz | 317/101 |
| 3,290,559 A | 12/1966 | Kirby et al. | |
| 3,313,986 A | 4/1967 | Kilby | |
| 3,377,516 A | 4/1968 | Ellett et al. | |
| 3,403,300 A | 9/1968 | Horowitz et al. | |
| 3,436,604 A | 4/1969 | Hyltin et al. | 317/101 |
| 3,515,949 A | 6/1970 | Michaels et al. | |
| 3,535,595 A | 10/1970 | Moore | |
| 3,614,541 A | 10/1971 | Farrand | 29/624 |
| 3,614,546 A | 10/1971 | Avins | 174/234 |
| 3,671,812 A | 6/1972 | Peluso et al. | 174/DIG. 3 |
| 3,713,893 A | 1/1973 | Hasty | 29/577 |
| 3,727,064 A | 4/1973 | Bottini | 250/217 |
| 3,746,934 A | 7/1973 | Stein | 317/101 |
| 3,925,801 A | 12/1975 | Haitz et al. | 357/19 |
| 3,949,274 A | 4/1976 | Anacker | 361/735 |
| 3,959,579 A | 5/1976 | Johnson | 257/698 |
| 4,017,963 A | 4/1977 | Beyerlein | 29/577 |
| 4,103,318 A | 7/1978 | Schwede | 361/388 |
| 4,116,518 A | 9/1978 | Pleskac | 439/69 |
| 4,116,519 A | 9/1978 | Grabbe et al. | 439/69 |
| 4,139,726 A | 2/1979 | Penrod et al. | 174/52 |
| 4,158,745 A | 6/1979 | Keller | 174/52 |
| 4,241,493 A | 12/1980 | Andrulitis et al. | 29/572 |
| 4,288,808 A | 9/1981 | Hantusch | 257/738 |

(List continued on next page.)

FOREIGN PATENT DOCUMENTS

| | | |
|---|---|---|
| EP | 122-687 A | 10/1984 |
| EP | 122-687 A | 10/1984 |
| EP | 0 298 211 A3 | 1/1989 |
| JP | 57-31166 A | 2/1982 |
| JP | 57-31166 A | 2/1982 |
| JP | 58-112348 A | 4/1983 |
| JP | 58-96756 A | 6/1983 |

(List continued on next page.)

OTHER PUBLICATIONS

Dense–Pac MicroSystems, Inc., "Short Form Catalog," 1990, 12 pages.

(List continued on next page.)

*Primary Examiner*—David Martin
*Assistant Examiner*—Thanh S. Phan
(74) *Attorney, Agent, or Firm*—J. Scott Denko; Steptoe & Johnson L.L.P.

(57) ABSTRACT

A system and method for selectively stacking and interconnecting individual integrated circuit devices to create a high density integrated circuit module. Connections between stack elements are made through carrier structures that provide inter-element connections that substantially follow an axis that is substantially perpendicular to the vertical axis of the stack. The carrier structure provides connection between elements through conductive paths disposed to provide connection between the foot of an upper IC element and the upper shoulder of the lower IC element. This leaves open to air flow most of the vertical transit section of the lower lead for cooling while creating an air gap between elements that encourages cooling airflow between the elements of the stack. A method for creating stacked integrated circuit modules according to the invention is provided.

24 Claims, 10 Drawing Sheets

U.S. PATENT DOCUMENTS

| | | | |
|---|---|---|---|
| 4,288,841 A | 9/1981 | Gogal | 361/414 |
| 4,321,418 A | 3/1982 | Dran et al. | 136/251 |
| 4,331,258 A | 5/1982 | Geschwind | 220/359 |
| 4,364,620 A | 12/1982 | Mulholland et al. | 439/525 |
| 4,371,912 A | 2/1983 | Guzik | 361/417 |
| 4,379,259 A | 4/1983 | Varadi et al. | 714/32 |
| 4,394,712 A | 7/1983 | Anthony | 361/411 |
| 4,398,235 A | 8/1983 | Lutz et al. | 361/393 |
| 4,406,508 A | 9/1983 | Sadigh-Behzadi | 339/75 |
| 4,437,235 A | 3/1984 | McIver | 29/840 |
| 4,451,973 A | 6/1984 | Tateno et al. | 29/588 |
| 4,521,828 A | 6/1985 | Fanning | 361/386 |
| 4,525,921 A | 7/1985 | Carson et al. | 29/577 |
| 4,571,663 A | 2/1986 | McPherson | 361/735 |
| 4,574,331 A | 3/1986 | Smolley | 361/735 |
| 4,630,172 A | 12/1986 | Stenerson et al. | 361/386 |
| 4,631,573 A | 12/1986 | Sutrina | 257/714 |
| 4,633,573 A | 1/1987 | Scherer | 29/589 |
| 4,638,348 A | 1/1987 | Brown et al. | 257/700 |
| 4,638,406 A | 1/1987 | Samson | 361/403 |
| 4,642,735 A | 2/1987 | Hodsdon et al. | 361/424 |
| 4,680,617 A | 7/1987 | Ross | 357/72 |
| 4,684,975 A | 8/1987 | Takiar et al. | 357/70 |
| 4,688,864 A | 8/1987 | Sorel | 361/730 |
| 4,696,525 A | 9/1987 | Coller | |
| 4,698,663 A | 10/1987 | Sugimoto et al. | 257/713 |
| 4,706,166 A | 11/1987 | Go | 361/403 |
| 4,712,129 A | 12/1987 | Orcutt | 357/84 |
| 4,722,060 A | 1/1988 | Quinn et al. | 364/490 |
| 4,733,461 A | 3/1988 | Nakano | 29/830 |
| 4,761,681 A | 8/1988 | Reid | 257/777 |
| 4,763,188 A | 8/1988 | Johnson | 357/74 |
| 4,764,846 A | 8/1988 | Go | 361/388 |
| 4,770,640 A | 9/1988 | Walter | 361/735 |
| 4,796,078 A | 1/1989 | Phelps, Jr. et al. | 357/68 |
| 4,821,007 A | 4/1989 | Fields et al. | 174/68.5 |
| 4,821,148 A | 4/1989 | Kobayashi et al. | 361/392 |
| 4,823,234 A | 4/1989 | Konishi et al. | 361/386 |
| 4,829,403 A | 5/1989 | Harding | 361/386 |
| 4,833,568 A | 5/1989 | Berhold | 361/383 |
| 4,839,717 A | 6/1989 | Phy et al. | 357/74 |
| 4,841,355 A | 6/1989 | Parks | 257/686 |
| 4,855,868 A | 8/1989 | Harding | 361/386 |
| 4,862,245 A | 8/1989 | Pashby et al. | 357/70 |
| 4,862,249 A | 8/1989 | Carlson | 357/80 |
| 4,868,712 A | 9/1989 | Woodman | 361/689 |
| 4,878,106 A | 10/1989 | Sachs | 357/72 |
| 4,884,237 A | 11/1989 | Mueller et al. | 365/63 |
| 4,891,789 A | 1/1990 | Quanttrini et al. | 365/63 |
| 4,924,352 A | 5/1990 | Septfons | 257/713 |
| 4,948,645 A | 8/1990 | Holzinger et al. | 428/40 |
| 4,953,005 A | 8/1990 | Carlson et al. | 357/80 |
| 4,953,060 A | 8/1990 | Lauffer et al. | 361/388 |
| 4,956,694 A | 9/1990 | Eide | 257/686 |
| 4,983,533 A | 1/1991 | Go | 437/7 |
| 4,994,411 A | 2/1991 | Naito et al. | 437/209 |
| 4,996,583 A | 2/1991 | Hatada | 257/724 |
| 4,996,587 A | 2/1991 | Hinrichsmeyer et al. | 257/686 |
| 4,997,517 A | 3/1991 | Parthasarathi | 156/630 |
| 5,001,545 A | 3/1991 | Kalfus et al. | 357/70 |
| 5,012,323 A | 4/1991 | Farnworth | 357/75 |
| 5,014,113 A | 5/1991 | Casto | 357/70 |
| 5,016,138 A | 5/1991 | Woodman | 361/381 |
| 5,025,307 A | 6/1991 | Ueda et al. | 257/696 |
| 5,031,072 A | 7/1991 | Malhi et al. | 361/706 |
| 5,034,350 A | 7/1991 | Marchisi | 437/207 |
| 5,041,015 A | 8/1991 | Travis | 439/492 |
| 5,041,395 A | 8/1991 | Steffen | 257/687 |
| 5,043,794 A | 8/1991 | Tai et al. | 257/686 |
| 5,049,527 A | 9/1991 | Merrick et al. | 437/220 |
| 5,057,903 A | 10/1991 | Olla | 357/72 |
| 5,057,906 A | 10/1991 | Ishigami | 357/80 |
| 5,058,265 A | 10/1991 | Goldfarb | 29/852 |
| 5,065,277 A | 11/1991 | Davidson | 361/383 |
| 5,068,708 A | 11/1991 | Newman | 357/68 |
| 5,086,018 A | 2/1992 | Conru et al. | 437/207 |
| 5,099,393 A | 3/1992 | Bentlage et al. | 361/413 |
| 5,101,324 A | 3/1992 | Sato | 361/400 |
| 5,104,820 A | 4/1992 | Go et al. | 437/51 |
| 5,107,328 A | 4/1992 | Kinsman | 257/782 |
| 5,108,553 A | 4/1992 | Foster et al. | 205/125 |
| 5,128,831 A | 7/1992 | Fox, III et al. | 361/396 |
| 5,138,430 A | 8/1992 | Gow, III et al. | 357/70 |
| 5,138,434 A | 8/1992 | Wood et al. | 357/74 |
| 5,140,745 A | 8/1992 | McKenzie, Jr. | 29/852 |
| 5,155,068 A | 10/1992 | Tada | 438/125 |
| 5,159,434 A | 10/1992 | Kohno et al. | 358/80 |
| 5,168,926 A | 12/1992 | Watson et al. | 165/185 |
| 5,198,888 A | 3/1993 | Sugano et al. | 257/686 |
| 5,200,362 A | 4/1993 | Lin et al. | 437/207 |
| 5,214,307 A | 5/1993 | Davis | 257/676 |
| 5,221,642 A | 6/1993 | Burns | 437/207 |
| 5,222,014 A | 6/1993 | Lin | 361/792 |
| 5,223,739 A | 6/1993 | Katsumata et al. | 257/676 |
| 5,214,845 A | 7/1993 | King et al. | 29/841 |
| 5,231,304 A | 7/1993 | Solomon | 257/684 |
| 5,236,117 A | 8/1993 | Roane et al. | 228/180.21 |
| 5,239,447 A | 8/1993 | Cotues et al. | 257/686 |
| 5,241,454 A | 8/1993 | Ameen et al. | 257/686 |
| 5,243,133 A | 9/1993 | Engle et al. | 174/52.4 |
| 5,247,423 A | 9/1993 | Lin et al. | 361/719 |
| 5,262,927 A | 11/1993 | Chia et al. | 361/784 |
| 5,266,834 A | 11/1993 | Nishi et al. | 257/706 |
| 5,273,940 A | 12/1993 | Sanders | 437/209 |
| 5,279,029 A | 1/1994 | Burns | 29/856 |
| 5,279,991 A | 1/1994 | Minahan et al. | 437/208 |
| 5,281,852 A | 1/1994 | Normington | 257/685 |
| 5,307,929 A | 5/1994 | Seidler | 206/311 |
| 5,311,060 A | 5/1994 | Rostoker et al. | 257/796 |
| 5,311,401 A | 5/1994 | Gates, Jr. et al. | 257/686 |
| 5,313,096 A | 5/1994 | Eide | 257/686 |
| 5,313,097 A | 5/1994 | Haj-Ali-Ahmadi et al. | 257/106 |
| 5,334,875 A * | 8/1994 | Sugano et al. | 257/686 |
| 5,343,075 A | 8/1994 | Nishino | 257/686 |
| 5,343,366 A | 8/1994 | Cipolla et al. | 257/685 |
| 5,347,428 A | 9/1994 | Carson et al. | 361/760 |
| 5,347,429 A | 9/1994 | Kohno et al. | 361/813 |
| 5,367,766 A | 11/1994 | Burns et al. | 29/848 |
| 5,369,056 A | 11/1994 | Burns et al. | 437/209 |
| 5,369,058 A | 11/1994 | Burns et al. | 438/118 |
| 5,371,866 A | 12/1994 | Cady | 395/400 |
| 5,373,189 A | 12/1994 | Massit et al. | 257/686 |
| 5,377,077 A | 12/1994 | Burns | 361/704 |
| 5,384,689 A | 1/1995 | Shen | 361/761 |
| 5,394,010 A | 2/1995 | Tazawa et al. | 257/686 |
| 5,397,916 A | 3/1995 | Normington | 257/686 |
| 5,420,751 A | 5/1995 | Burns et al. | 361/707 |
| 5,426,566 A | 6/1995 | Beilstein, Jr. et al. | 257/686 |
| 5,446,313 A | 8/1995 | Masuda et al. | 257/666 |
| 5,446,620 A | 8/1995 | Burns et al. | 361/704 |
| 5,471,369 A * | 11/1995 | Honda et al. | 361/813 |
| 5,475,920 A | 12/1995 | Burns et al. | 29/856 |
| 5,479,318 A | 12/1995 | Burns | 361/735 |
| 5,481,133 A | 1/1996 | Hsu | 257/686 |
| 5,484,959 A | 1/1996 | Burns | 174/524 |
| 5,493,476 A | 2/1996 | Burns | 361/735 |
| 5,499,160 A | 3/1996 | Burns | 361/704 |
| 5,514,907 A | 5/1996 | Moshayedi | 257/723 |
| 5,523,619 A | 6/1996 | McAllister et al. | 257/686 |
| 5,543,664 A | 8/1996 | Burns | 257/787 |
| 5,550,711 A | 8/1996 | Burns et al. | 361/728 |

| | | | |
|---|---|---|---|
| 5,552,963 A | 9/1996 | Burns | 257/686 |
| 5,561,591 A | 10/1996 | Burns | 361/704 |
| 5,566,051 A | 10/1996 | Burns | 361/704 |
| 5,586,009 A | 12/1996 | Burns | 257/685 |
| 5,588,205 A | 12/1996 | Roane | 29/830 |
| 5,592,364 A | 1/1997 | Roane | 361/735 |
| 5,605,592 A | 2/1997 | Burns | 361/790 |
| 5,612,570 A | 3/1997 | Eide et al. | 257/685 |
| 5,615,475 A | 4/1997 | Burns | 257/686 |
| 5,631,193 A | 5/1997 | Burns | 29/827 |
| 5,644,161 A | 7/1997 | Burns | 257/668 |
| 5,654,877 A | 8/1997 | Burns | 361/713 |
| 5,656,856 A * | 8/1997 | Kweon | 257/686 |
| 5,657,537 A | 8/1997 | Saia et al. | 29/830 |
| 5,723,903 A | 3/1998 | Masuda et al. | 257/686 |
| 5,778,522 A | 7/1998 | Burns | 29/830 |
| 5,783,464 A | 7/1998 | Burns | 438/112 |
| 5,801,437 A | 9/1998 | Burns | 257/685 |
| 5,804,870 A | 9/1998 | Burns | 357/666 |
| 5,814,881 A * | 9/1998 | Alagratnam et al. | 257/686 |
| 5,828,125 A | 10/1998 | Burns | 257/668 |
| 5,835,988 A | 11/1998 | Ishii | 257/684 |
| 5,843,807 A | 12/1998 | Burns | 438/109 |
| 5,864,175 A | 1/1999 | Burns | 257/684 |
| 5,895,232 A | 4/1999 | Burns | 438/107 |
| 5,960,539 A | 10/1999 | Burns | 29/854 |
| 5,978,227 A | 11/1999 | Burns | 361/735 |
| 6,025,642 A | 2/2000 | Burns | 29/830 |
| 6,028,352 A | 2/2000 | Eide | 257/686 |
| 6,049,123 A | 4/2000 | Burns | 257/686 |
| 6,040,983 A * | 5/2000 | Baudouin et al. | 361/760 |
| RE36,916 E | 10/2000 | Moshayedi | 257/723 |
| 6,168,970 B1 | 1/2001 | Burns | 438/106 |
| 6,194,247 B1 | 2/2001 | Burns et al. | 438/107 |
| 6,205,654 B1 | 3/2001 | Burns | 29/830 |
| 6,288,907 B1 | 9/2001 | Burns | 361/783 |
| 6,310,392 B1 | 10/2001 | Burns | 257/723 |
| 6,316,825 B1 * | 11/2001 | Park et al. | 257/686 |

FOREIGN PATENT DOCUMENTS

| | | |
|---|---|---|
| JP | 58-112348 A | 7/1983 |
| JP | 58-96756 A | 8/1983 |
| JP | 58-219757 A | 12/1983 |
| JP | 60-160641 | 8/1985 |
| JP | 60-254762 | 12/1985 |
| JP | 61-63048 | 4/1986 |
| JP | 61-75558 | 4/1986 |
| JP | 61-163652 A | 7/1986 |
| JP | 61-219143 A | 9/1986 |
| JP | 62-230027 A | 8/1987 |
| JP | 62-230027 A | 10/1987 |
| JP | 63-117451 A | 5/1988 |
| JP | 63-123849 | 6/1988 |
| JP | 63-153849 A | 6/1988 |
| JP | 2-260448 | 10/1990 |
| JP | 3-96266 | 4/1991 |
| JP | 3-167868 A | 7/1991 |
| JP | 4-209562 | 7/1992 |
| JP | 6-77644 | 8/1992 |
| RU | SU 834-957 | 5/1981 |
| SU | 834-957 | 5/1981 |

OTHER PUBLICATIONS

"Electronic Packaging & Production" article, A cahners Publication, Jan. 1992, 2 pages.

IBM Technical Disclosure Bulletin, Edge–Mounted MLC Packaging Scheme, vol. 23, No. 12, May 1981.

IBM Technical Disclosure Bulletin, Process for Producing Lateral Chip Connectors, vol. 32, No. 3B, Aug. 1989.

IBM Technical Disclosure Bulletin, Vertical Chip Packaging, vol. 20, No. 11A, Apr. 1978.

International Electron Device Meeting, IEDM Technical Digest, Washington, D.C., Dec. 6–7, 1987.

"Introducing a Revolutionary 3 Dimensional Package Type–THE SLCC," John Forthun, Advancement in Technology.

"New levels of hybrid IC density are provided by Three–Dimensional Packaging"article, 2 pages.

Patent Abstract of Japan, Publication No. 05029534, Published May 2, 1993 Inventor: Nakamura Shigemi, entitled "Memory Module", European Patent Office.

Research Disclosure, Organic Card Device Carrier, 31318, May 1990, No. 313.

Tuckerman, D.B. et al., "Laminated Memory: A New 3–Dimensional Packaging Technology for MCMs" article, nCHIP, Inc., IEEE, 1994.

1992 Proceedings, 42$^{nd}$ Electronic Components & Technology Conference, May 18–20, 1992.

"Declaration of Mark Moshayedi in Support of Plaintiff/CounterDefendant's Motion for Summary Judgment of Non–Infringement of U.S. Patent No. 4,956,694," Civil Action No. SACV 98–822, *Simple Technology, Inc. v. Dense–Pac Microsystems, Inc.,* 20 total pages (9 pages. of the Declaration and 11 pages. of attachments to Declaration).

"Alternative assembly for memory ICs," XP–002093051, Electronic Engineering, Jan. 1987, p.22.

3–D Integrated Packaging and Interconnect Technology, Wescon/90 Conference Record, held Nov. 13–15, 1990, Anaheim, CA.

Dense–Pac Microsystems, "3–D Technology," 1993, 15 pages.

Dense–Pac Microsystems, 16–Megabit High Speed CMOS SRAM.

Dense–Pac Microsystems, 128–Megabyte SDRAM SODIMM.

Dense–Pac Microsystems, 256–Megabyte CMOS DRAM.

Dense–Pac Microsystems, "While others are still defining it . . . Our customers are cashing in!" flyer.

Dense–Pac Microsystems, Inc., "Memory Products–Short Form–04," 1994, 5 pages.

Dense–Pac MicroSystems, Inc., "Short Form Catalog," 1991, 20 pages.

Dean Frew, "High Density Memory Packaging Technology/ High Speed Imaging Applications," *SPIE vol. 1346 Ultra–high– and High–Speed Photography, Videography, Photonics, and Velocimetry '90* , pp. 200–209.

Alvin Weinberg and W. Kinzy Jones, "Vertically–Integrated Package, " *IEEE* , pp. 436–443.

"Alterable Interposer Block for Personalizing Stacked Module Interconnections," *IBM Technical Disclosure Bulletin* , vol. 30, No. 8, Jan. 8, 1988, pp. 373–374.

Catalog of Dense–Pac Microsystems, Inc. describing two products: DPS512X16A3Ceramic 512K X 16 CMOS SRAM Module and DPS512X16AA3 High Speed Ceramic 512K X 16 CMOS SRAM Module, pp. 8–65—8–70.

\* cited by examiner

STACKING SYSTEM AND METHOD

TECHNICAL FIELD

The present invention relates to aggregating integrated circuits and, in particular, to stacking integrated circuits.

BACKGROUND OF THE INVENTION

A variety of techniques are used to stack integrated circuits. Some require that the circuits be encapsulated in special packages, while others use circuits in conventional packages. In some cases, the leads alone of packaged circuits have been used to create the stack and interconnect its constituent elements. In other techniques, structural elements such as rails are used to create the stack and interconnect the constituent elements.

Circuit boards in vertical orientations have been used to provide interconnection between stack elements. For example, in U.S. Pat. No. 5,514,907 to Moshayedi, a technique is described for creating a multi-chip module from surface-mount packaged memory chips. The devices are interconnected on their lead emergent edges through printed circuit boards oriented vertically to a carrier or motherboard that is contacted by connective sites along the bottom of the edge-placed PCBs. Japanese Patent Laid-open Publication No. Hei 6-77644 discloses vertical PCBs used as side boards to interconnect packaged circuit members of the stack.

Others have stacked integrated circuits without casings or carrier plates. Electrical conductors are provided at the edges of the semiconductor bodies and extended perpendicularly to the planes of the circuit bodies. Such a system is shown in U.S. Pat. No. 3,746,934 to Stein.

Still others have stacked packaged circuits using interconnection packages similar to the packages within which the integrated circuits of the stack are contained to route functionally similar terminal leads in non-corresponding lead positions. An example is found in U.S. Pat. No. 4,398,235 to Lutz et al. Simple piggyback stacking of DIPs has been shown in U.S. Pat. No. 4,521,828 to Fanning.

Some more recent methods have employed rail-like structures used to provide interconnection and structural integrity to the aggregated stack. The rails are either discrete elements that are added to the structure or are crafted from specific orientations of the leads of the constituent circuit packages. For example, in U.S. Pat. No. 5,266,834 to Nishi et al., one depicted embodiment illustrates a stack created by selective orientation of the leads of particularly configured stack elements, while in U.S. Pat. No. 5,343,075 to Nishino, a stack of semiconductor devices is created with contact plates having connective lines on inner surfaces to connect the elements of the stack.

More recently, sophisticated techniques have been developed for stacking integrated circuits. The assignee of the present invention has developed a variety of such techniques for stacking integrated circuits. In one such method, multiple conventional ICs are stacked and external leads are interconnected with one another by means of a rail assembly. The rails are made of flat strips of metal and the rails define apertures that receive the leads of the discrete IC packages. An example of this system is shown in U.S. Pat. No. 5,778,522 assigned to the assignee of the present invention.

An even more recent technique developed by the assignee of the present invention interconnects conventionally packaged ICs with flexible circuits disposed between stack elements. The flexible circuits include an array of flexible conductors supported by insulating sheets. Terminal portions of the flexible conductors are bent and positioned to interconnect appropriate leads of respective upper and lower IC packages.

Some of the previously described systems have required encapsulation of the constituent ICs in special packages. Still others have added rails that must be custom-fabricated for the application. Many have relied upon connections that substantially coincide with the vertical orientation of the stack and thus require more materials while often adding excessive height to the stack. Others that use PCBs have inhibited heat dissipation of the stack. Most have deficiencies that add expense or complexity or thermal inefficiency to stacked integrated circuits. What is needed therefore, is a technique and system for stacking integrated circuits that provides a thermally efficient, robust structure while not adding excessive height to the stack yet allowing production at reasonable cost with easily understood and managed materials.

SUMMARY OF THE INVENTION

The present invention provides a system and method for selectively stacking and interconnecting individual integrated circuit devices to create a high density integrated circuit module. It is principally designed for use with memory circuits, but can be employed to advantage with any integrated circuits where size conservation and use of duplicative circuitry are present considerations.

In a preferred embodiment, conventional TSOP memory circuits are vertically stacked one above the other. The stack consists of two packaged integrated circuits, but alternatives may employ greater numbers of ICs.

Connections between stack elements are made through carrier structures that provide inter-element connections that transit from one IC to another IC to conserve material and create a stack having improved air flow and consequent heat transference. This is accomplished by having the interelement connections substantially follow an axis that is substantially perpendicular to the vertical axis of the stack. The carrier structure and inter-element connections cooperate to adapt the inherent structural features of the leads of the constituent elements into a stack framework having appropriate integrity.

In a preferred embodiment, electronic connections between stack elements are supported by printed circuit board or other support material. The connection between elements is made by conductive paths disposed to provide connection between the feet of leads of an upper IC element and the upper shoulder of leads of a lower IC element. This leaves open to air flow, most of the transit section of the lower lead for cooling, while creating an air gap between elements that encourages cooling airflow between the elements of the stack and minimizes fabrication complexity.

A method for creating stacked integrated circuit modules is provided that provides reasonable cost, mass production techniques to produce modules.

DETAILED DESCRIPTION OF EMBODIMENTS

Figure 1:
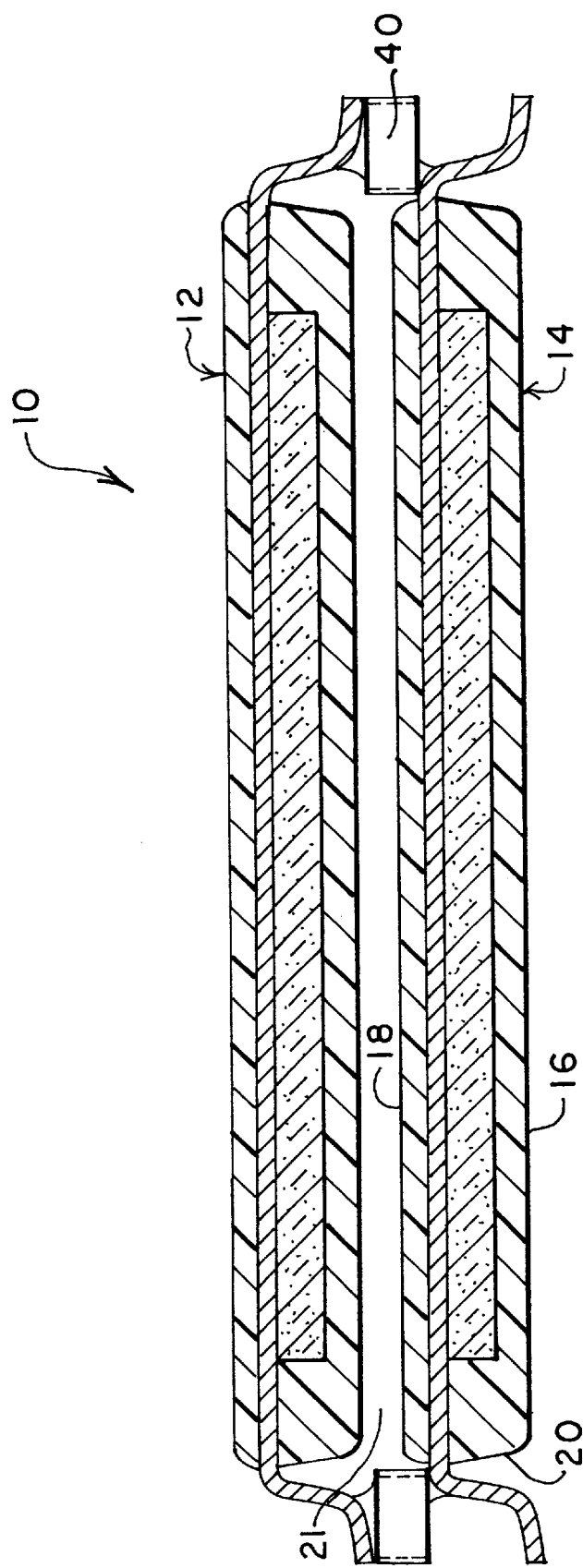
FIG. 1 depicts a circuit module composed of a stack of two packaged integrated circuits devised in accordance with the present invention.

FIG. 1 depicts a high density memory module 10 devised in accordance with the present invention. The present invention is adaptable to a variety of IC circuits and, in its preferred implementation, memory Circuits of a variety of capacities. Module 10 in created with upper IC 12 and lower IC 14. Each of ICs 12 and 14 are, in the depicted preferred embodiment, plastic encapsulated memory circuits disposed in thin small outline packages known as TSOPs. Other package types may be used with the present invention as well as packaged circuits other than memories, but, as described here as preferred examples, the invention is advantageously implemented with memories in TSOP packaging. As shown in FIG. 1 as to lower IC 14, but present in both IC 12 and 14 of module 10, each IC has a lower surface 16, upper surface 18 and periphery 20. In this embodiment, there is an air gap 21 between IC 12 and IC 14 although a heat transference material may reside between the ICs.

Figure 2:
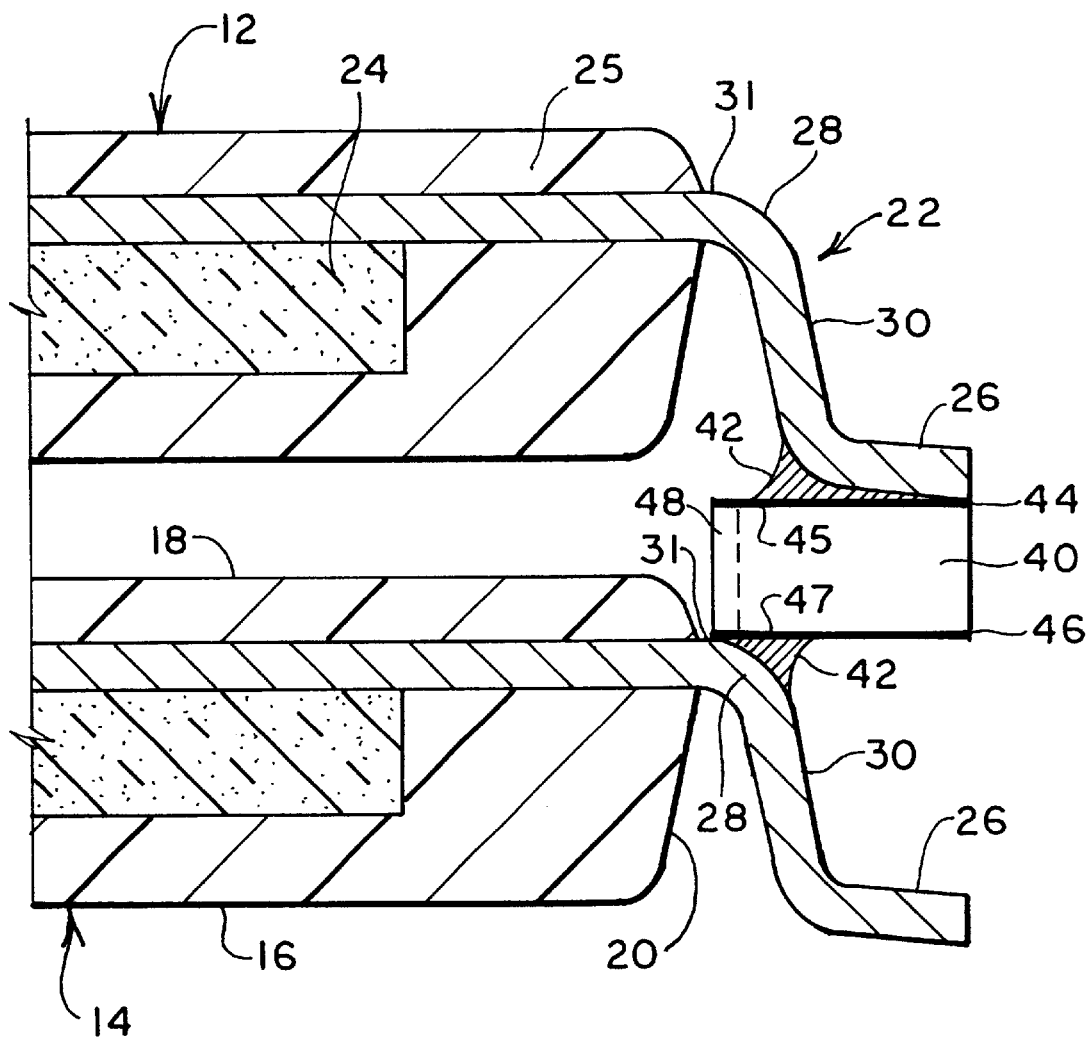
FIG. 2 is a view of a connection between two stack elements in the embodiment depicted in FIG. 1.

As depicted in FIG. 2, emergent from package peripheral wall 20, leads such as illustrated lead 22, provide a connective pathway for the electronics of the circuitry chip 24 embedded within plastic casing 26 of exemplar IC 12. Lead 22 of upper IC 12 is shown as having foot 26 and shoulder 28 and transit section 30 but similar features may be identified in lead 22 of lower IC 14. Shoulder 28 can extend from and include the planar part of lead 22 emergent from peripheral wall 20 (i.e., the "head" of the shoulder identified by reference 31) to the end of the curvature into transit section 30. As leads 22 emerge from the package periphery, a supportive shelf or plane is created or defined (respectively) by the heads of the plurality of leads on a side. These features of lead 22 are present in conventional TSOP packaged memory circuits available from most major suppliers of memories such as Samsung and Micron Technology, for example. Foot 26 is provided to allow the mounting of the TSOP IC on the surface of a printed circuit or other carrier and signal transit board. Shoulder 28 arises from providing foot 26 for surface mount connection of the IC, while transit section 30 of lead 22 connects shoulder 28 with foot 26. In practice, lead 22 and, in particular, transit section 30 are surfaces from which heat from internal chip 24 is dissipated by local air convection. Transit section 30 is often a substantially straight path but may exhibit curvature.

Figure 3:
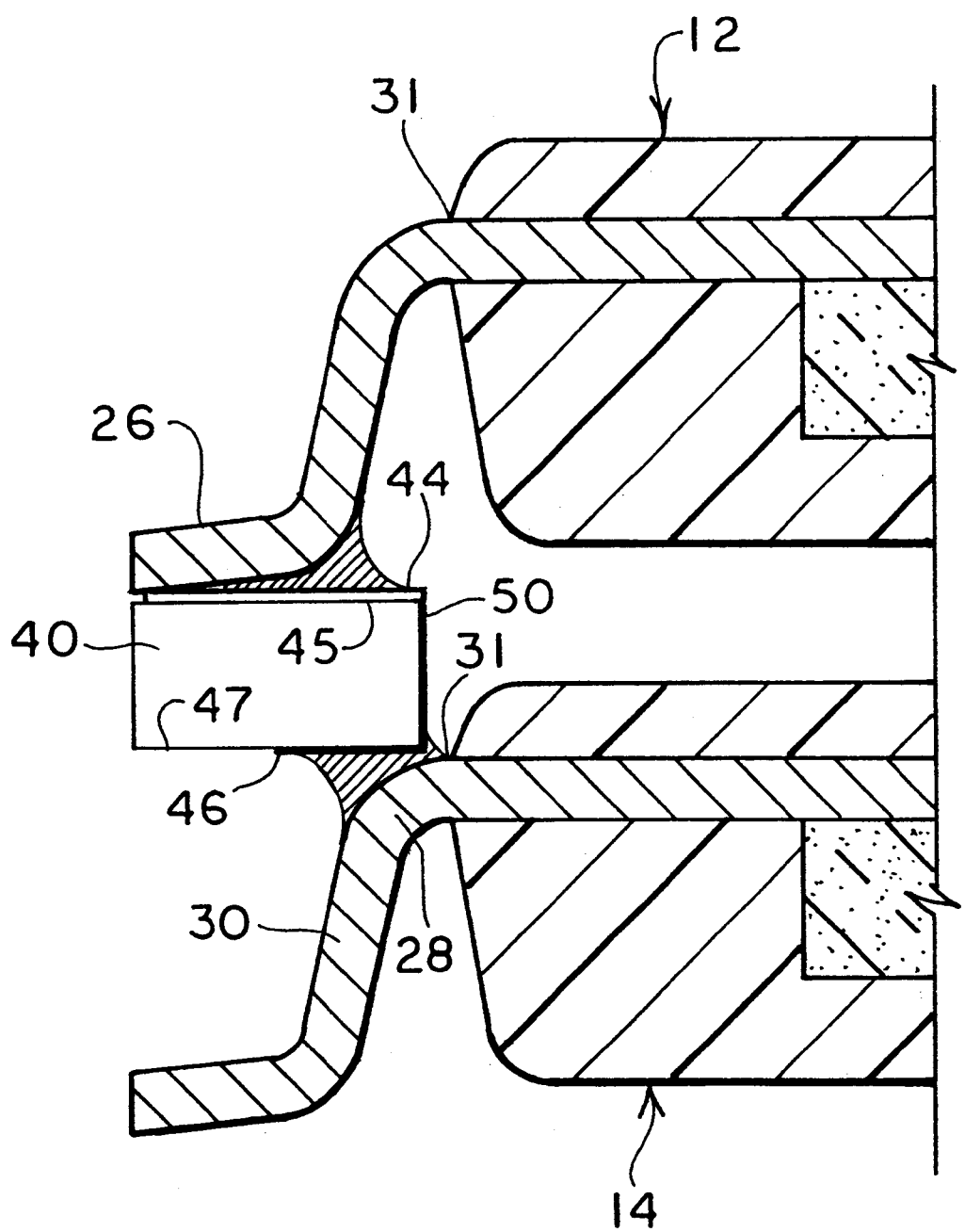
FIG. 3 shows an alternative embodiment of a circuit module devised in accordance with the present invention.

Carrier structure 40 is shown in FIG. 2 as being interposed between shoulder 28 of lead 22 of lower IC 14 and foot 26 of lead 22 of upper IC 12. Carrier structure 40, in a preferred embodiment, has upper and lower substantially planar surfaces 45 and 47, respectively. Upper surface 45 bears a row of upper connective elements 44 and lower surface 47 bears a row of lower connective elements 46. These elements 44 and 46 may rest on surfaces 45 and 47 or be embedded into those surfaces. In the module, upper connective elements 44 are disposed beneath the feet of the leads of IC 12 and the lower surface 47 is placed along the plane of heads 31 of selected leads of lower IC 14 as shown in FIGS. 2 and 3. While being beneath the feet of the leads, it should be understood that carrier structure 40 and/or upper connective element 44 may have an extent greater or lesser as well as coincident with the feet of the leads of IC 12. Carrier structure 40 is, in a preferred embodiment, printed circuit board material or other carrier material disposed between corresponding leads of constituent elements of module 10. Other structures that provide connective elements in an insulative bed or carrier may be employed as carrier structure 40. So called flex circuit, known to those of skill in the art is an example of an alternative material for carrier structure 40. Carrier structure 40 retains upper IC 12 in orientation with lower IC 14. Carrier structure 40 provides a horizontal structure to support electrical connection between appropriate leads of upper and lower ICs 12 and 14. Although it provides horizontal carriage of the electrical connection, parts of the conductive path may be coincident in orientation to the main axis of module 10. The principal orientation of the connective paths provided by carrier structure 40 is, however, perpendicular to the main vertical axis of the created module. Thus, the connective path principally follows a horizontal path. The provision of the horizontal carrier provides structural and fabrication advantages not found in simple structures used in previous stacks. For example, such a method and structure exploits the existing lead assemblage of the constituent ICs to craft a module defining cage or framework. Although the leads are provided by the TSOP manufacturer to enable surface mounting (SMT) of the TSOP, the horizontal carrier structure 40 provides advantages to the lead assemblage, namely, a low capacitance carrier for a conductive pathway that allows inter-element spacing, efficient cooling, and simple stack construction and interconnectivity with structural integrity and appropriate height.

Two carrier structures 40 are generally used in a two element module 10. One structure 40 is disposed along one periphery of module 10, while another carrier structure 40 is disposed in conjunction with an opposite periphery of the module.

Carrier structure 40 is preferably devised from printed circuit board. As discussed, other materials may be used as carrier structure 40. The readily understood technology of PCBs provides, however, and allows, as will be explained below, an efficient and cost-effective method for the fabrication of modules that reflect the invention disclosed here.

Carrier structure 40 is soldered into place as shown by solder 42 that improves the connection of foot 26 of upper IC 12 with upper connective element 44 (in this case, a trace) of carrier structure 40. In the embodiment shown in FIG. 2, connective elements 44 and 46 are etched traces, but other means of providing the connection are known in the art and within the scope of the invention. Solder 42 is also shown providing certain connection between lead 22 of lower IC 14 and lower connective element 46 (in this case, also a trace) of carrier structure 40.

Upper and lower connective elements 44 and 46 are connected to each other in the embodiment shown in FIG. 2 through a plated through hole or via 48 that is drilled in the PCB during stack fabrication. The use of vias to connect conductive planes or traces in PCB technology is well known to those of skill in the art. When a multi-layer PCB board is used as carrier structure 40, a "blind" via may be used in the path of connection between upper and lower connective elements 44 and 46. In a preferred embodiment, via 48 is cut through length-wise to create a castellation-like structure. This can be done when the greater part of carrier structure 40 is, in a preferred technique for fabrication of module 10, routed in a larger PCB board used to construct module 10. It will be noted, however, that via 48 is shown disposed on the interior of module 10. This provides protection against environmental hazards. Via 48 may also be disposed on the exterior of module 10. Placement within module 10 is not essential to the invention either for via 48 or other connective structures used in the present invention to connect upper with lower connective elements 44 and 46. Further, via 48 need not be bisected. Inside placement will, however, provide sufficient room for connective traces to be provided for efficient differential element enablement. Other connectives besides vias may be used to conduct signals between upper and lower connectives 44 and 46. For example, a connective element may be used through the body of carrier structure 40. Traces on the exterior vertical sides of carrier 40 may be used. Alternatively, multi-layer boards may be used to provide the connection.

Figure 4:
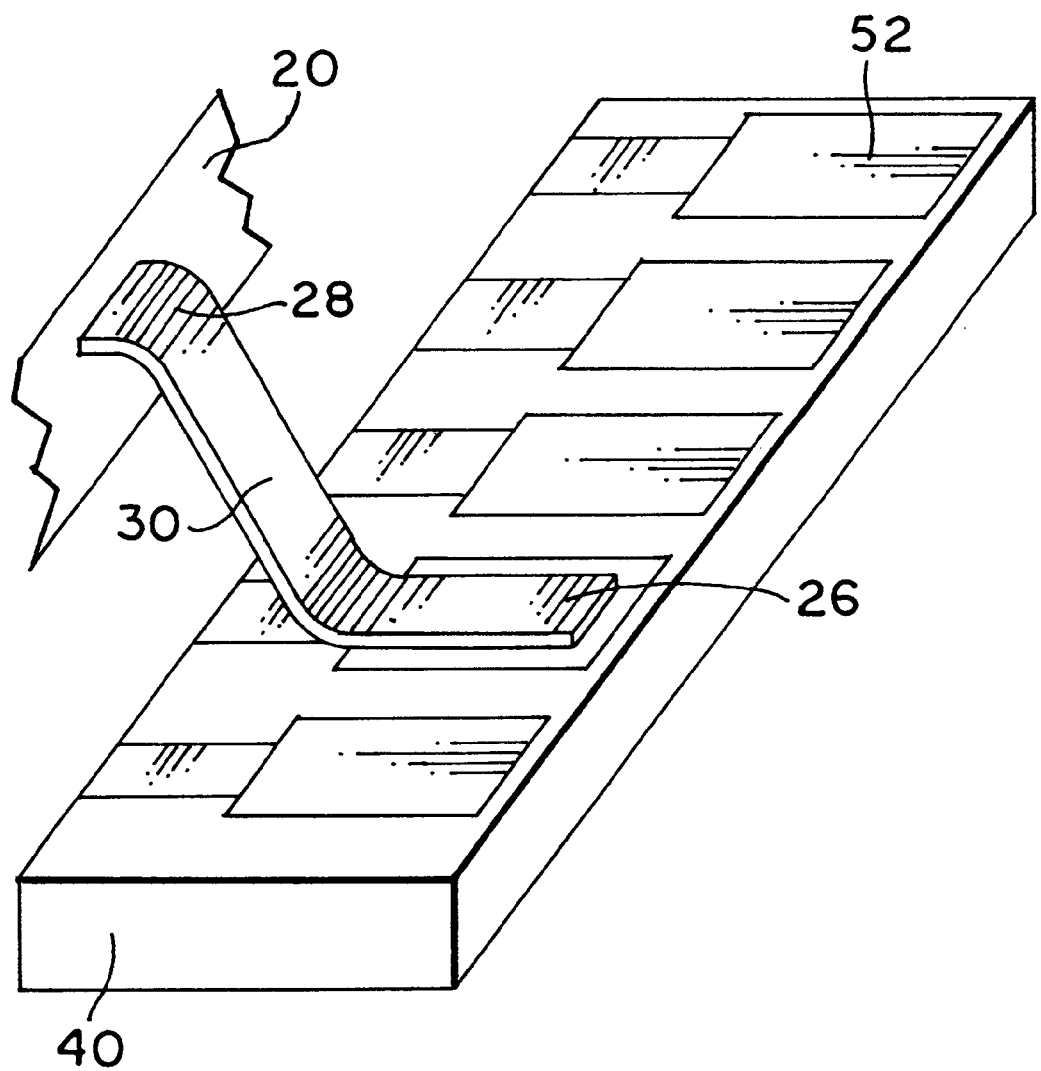
FIG. 4 depicts the connection of the foot of one exemplar lead of an upper IC to an embodiment of the carrier structure of the present invention.

FIG. 3 is a sectional view of a module 10 implemented according to the present invention in which a trace 50 is used to connect upper trace 44 with lower trace 46 of carrier structure 40. FIG. 4 is a view showing lone lead of upper IC 12 emergent from periphery 20, the lead having shoulder 28, transit section 30 and foot 26. Foot 26 is shown as attached to carrier structure 40. In this embodiment, carrier structure 40 has been implemented with upper connective elements 44 and specialized upper connective element pad 52. The use of a discrete pad such as 52 for connection to the foot of the lead is not required, but may be advantageous in embodiments where the pitch between leads allows. It will be noted that in this depiction, connection between upper connective 44 to lower connective element 46 (not shown) is on the inside edge of carrier structure 40 as disposed in place in module 10.

Figure 5:
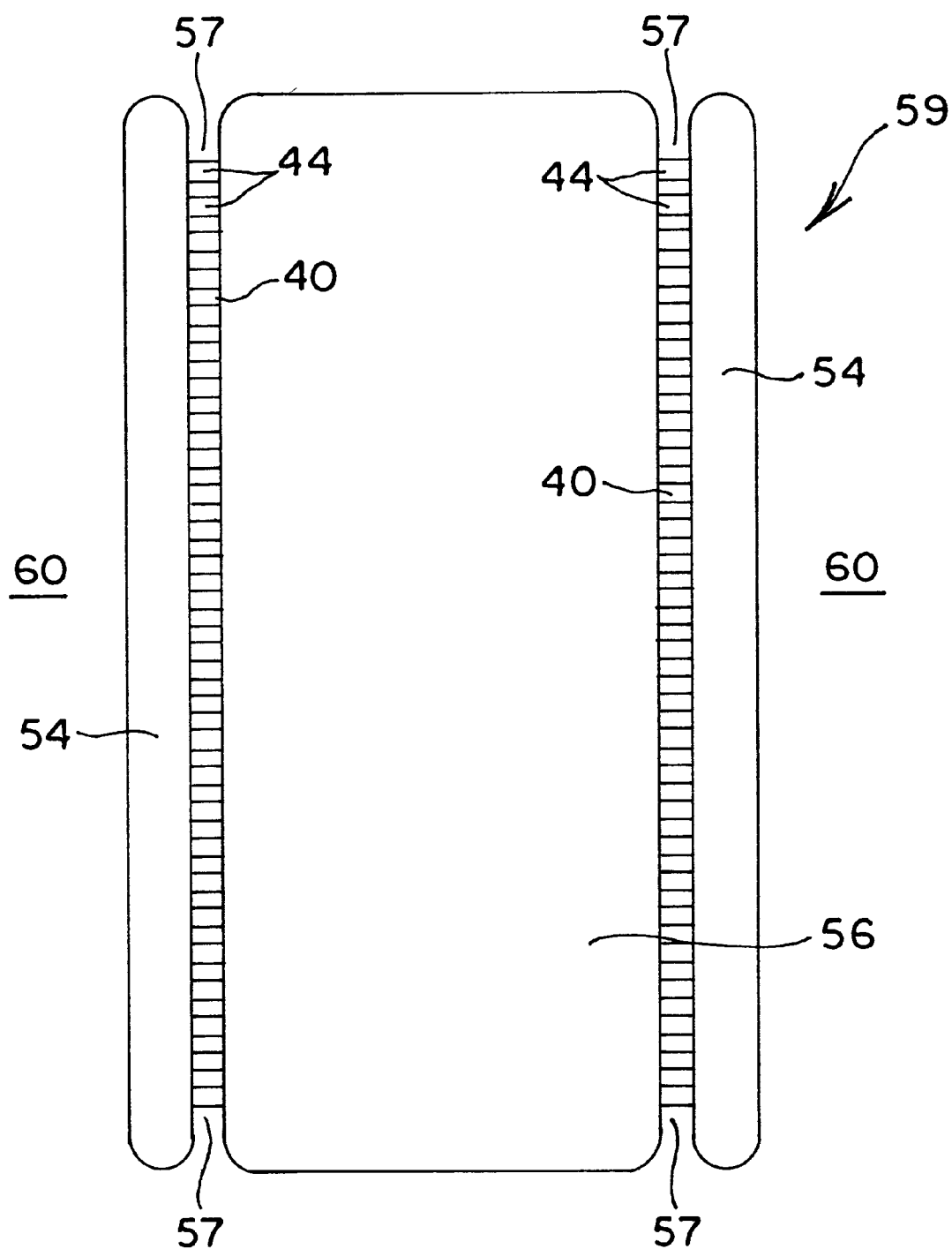
FIG. 5 depicts an upper plan view of a printed circuit board structure used in a method of the present invention.
Figure 6:
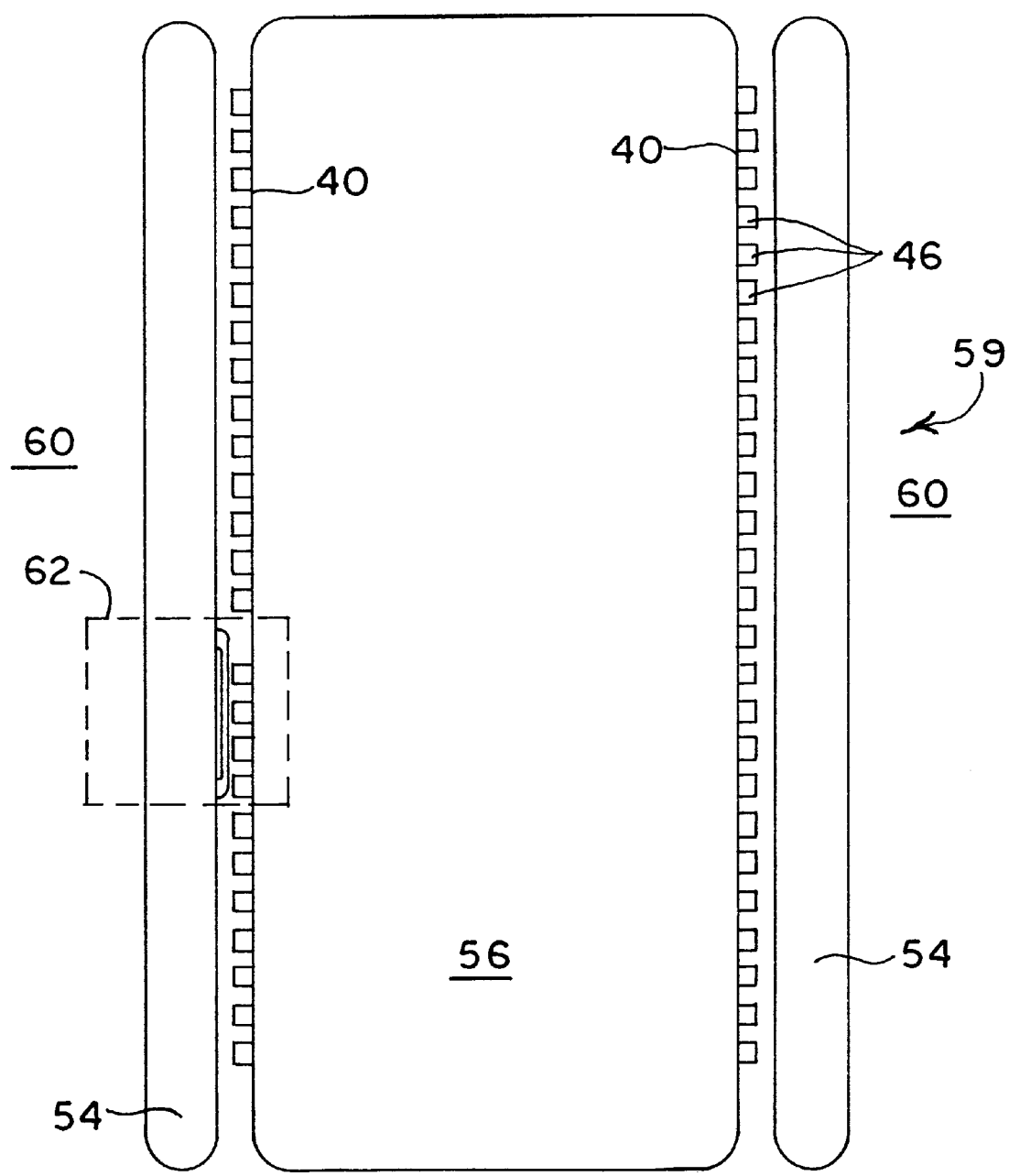
FIG. 6 is a lower plan view of the PCB shown in FIG. 5.
Figure 7:
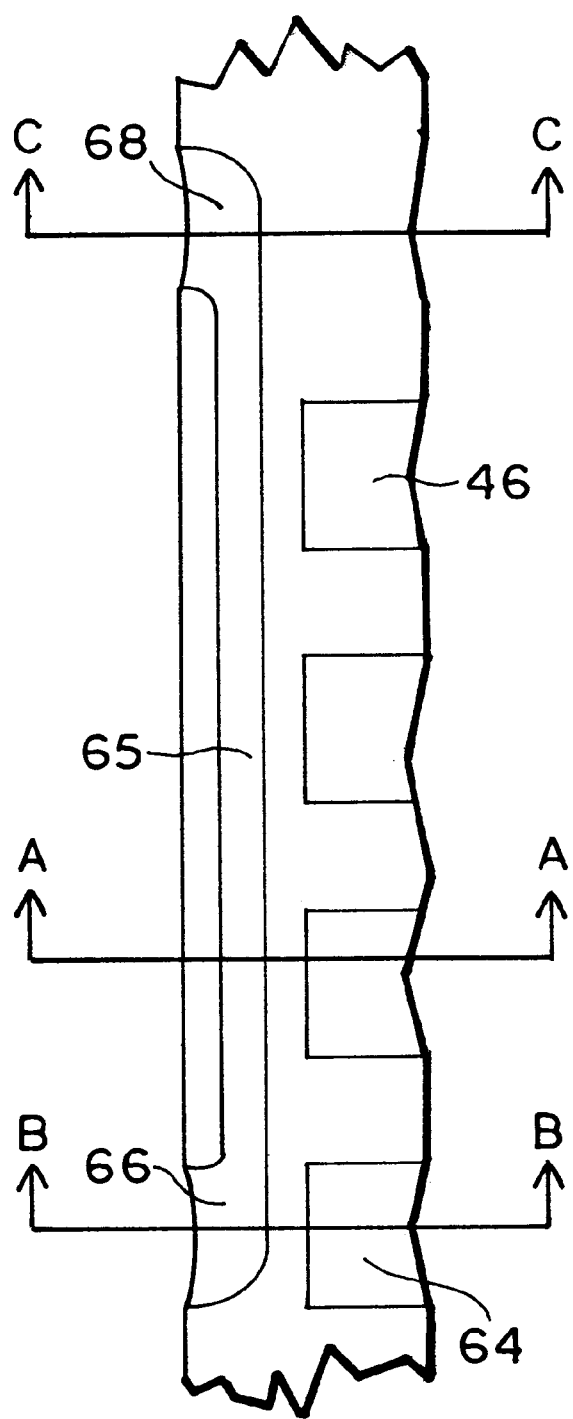
FIG. 7 shows an enlarged detail from FIG. 6.

FIG. 5 depicts an upper plan view of a part of a PCB routed and etched to provide a construction structure 59 for the creation of a circuit module of stacked integrated circuits according to an embodiment of the present invention. FIG. 6 is a lower plan view of the PCB shown in FIG. 5. FIG. 7 shows an enlarged detail from FIG. 6 showing the trace used to provide selective enablement of the constituent elements of module 10.

In FIGS. 5 and 6, orifices 54 are routed openings through a PCB 60 having upper and lower conductive surfaces. The upper and lower conductive surfaces of PCB 60 are etched to create the appropriate pattern for the upper and lower connective elements 44 and 46, respectively. Central opening 56 provides a space through which the body of lower IC 14 is disposed to allow the shoulders of leads of lower IC 14 to contact lower connective elements (traces) 46 of each of the two carrier structures 40 which are, at this stage of fabrication, still connected to the body of PCB 60 through bridges 57. Bridges 57 are cut after upper and lower ICs 12 and 14 are soldered into place.

In practice, lower IC 14 is disposed upside down ("dead bug"). coincident with central opening 56 as seen in the view of FIG. 6. Lower IC 14 is preferably placed in position with a pick and place machine or similar precision placement mechanism to accurately dispose the IC relative to the lower connective elements (traces) 46 of the two carrier structures 40. It will be understood that multiple iterations of construction structure 59 shown in FIGS. 5 and 6 are preferably created in one larger PCB and that the body of lower IC 14 may or may not be emergent into opening 56 depending upon the construction of ICs 12 and 14. Once construction structure 59 is populated with lower ICs 14, solder paste and reflow solder techniques known in the art are used to adhere lower IC 14 to the still attached to PCB 60 carrier structures 40. In a preferred embodiment, once soldered into place, the now populated with lower ICs 14 assembly of multiple stacks in progress is positioned to allow placement of the upper ICs 12 to contact the upper conductive elements 44 shown in FIG. 5. Again, the assembly is soldered and, after cooling, the carrier structures 40 are cut away from the PCB matrix 60 thus leaving created module(s) 10.

FIG. 7 is an enlargement of area 62 shown in FIG. 6. The particular one of lower conductive elements 46 shown identified by reference 64 makes contact with an unused no-connect lead of lower IC 14. To enable upper IC 12, a signal may be applied to a no connect lead of lower IC 14 that contacts connective element 64 of carrier structure 40. That signal is conveyed from connective element 64 to the enablement trace 65 that extends from termini 66 to 68. That connection may be by way of the corresponding upper connective element 44. From terminus 68 of enablement trace 65, the signal is brought by way of the appropriate upper connective element 44 to the upper IC 12 lead that receives enable signals. Enablement trace 65 is created to allow a signal applied to a no-connect lead of lower IC 14 to enable upper IC 12 by conveying that enablement signal from the unused lead of lower IC 14 to an enabling active lead of upper IC 12. Thus, the constituent elements of module 10 may be selectively. enabled in the context of the disclosed invention. Other similar techniques for differential enablement using similar methods may be used. The placement requirements of enablement trace 65 may cause the disposition of the upper to lower connective 53 or via 48 or other connective to be on the interior of the carrier structure relative to the module.

Figure 8:
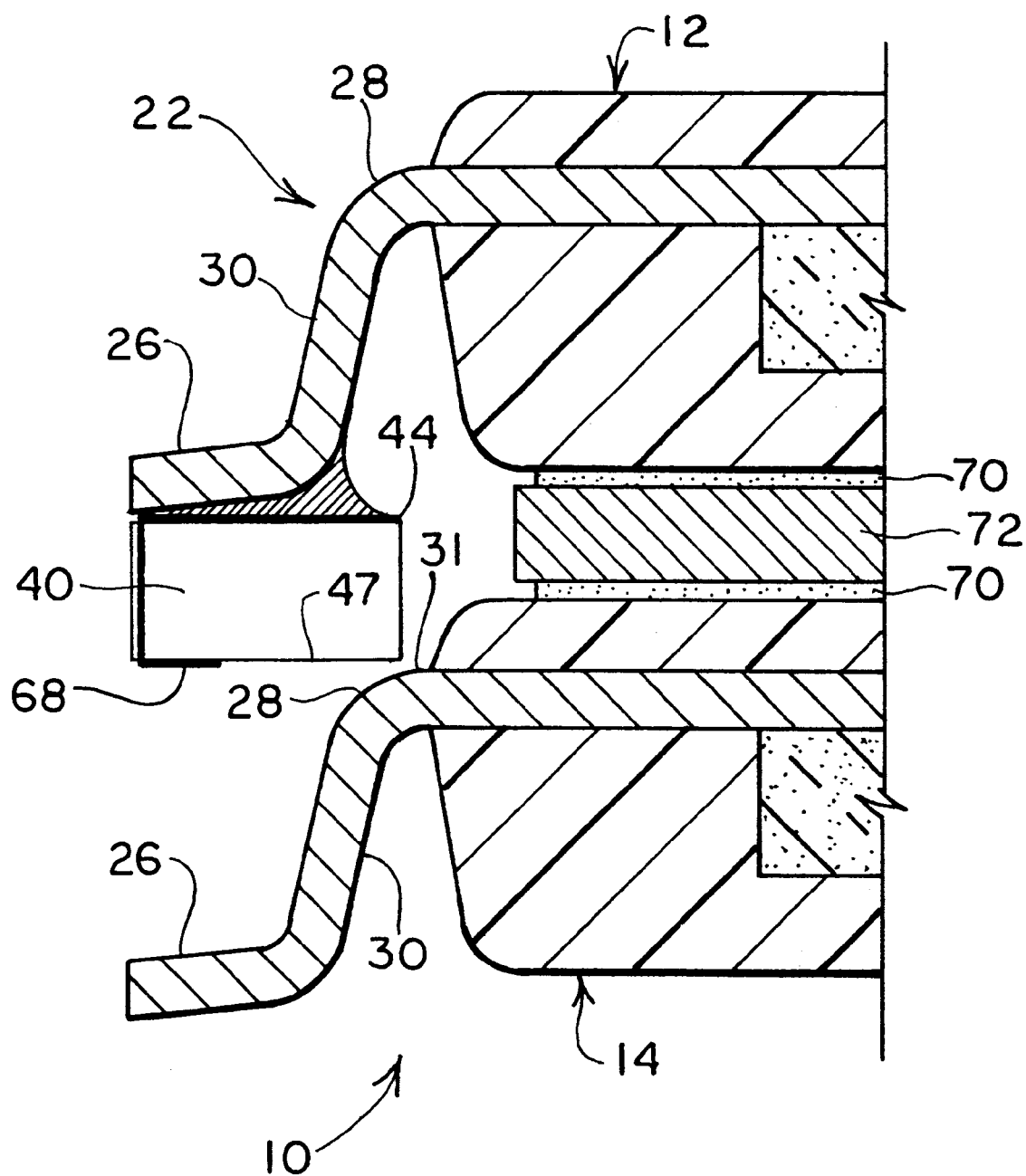
FIG. 8 depicts a sectional view of the connection structure along line C—C of FIG. 7.
Figure 9:
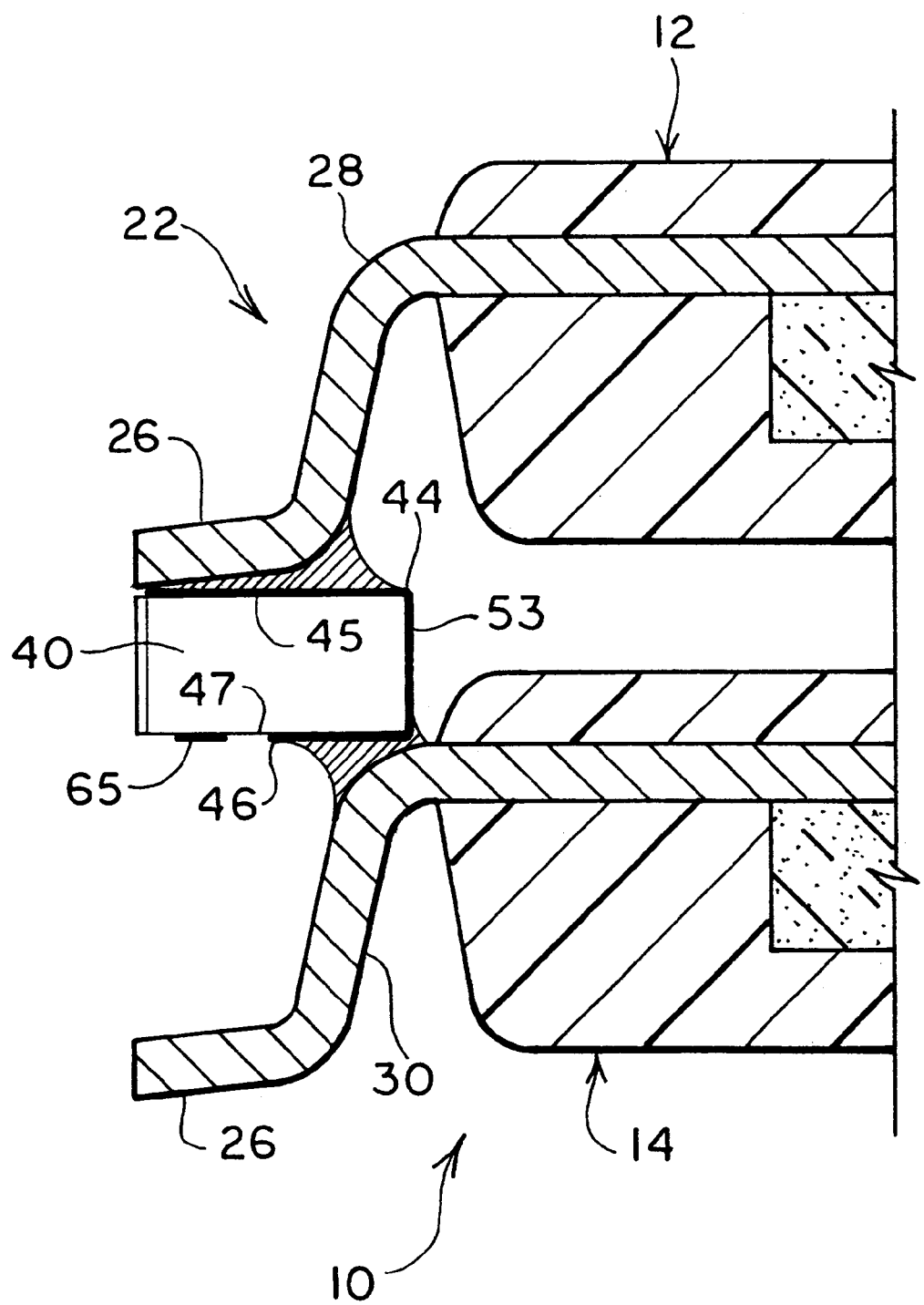
FIG. 9 depicts a sectional view of the connection structure along line B–C of FIG. 7.
Figure 10:
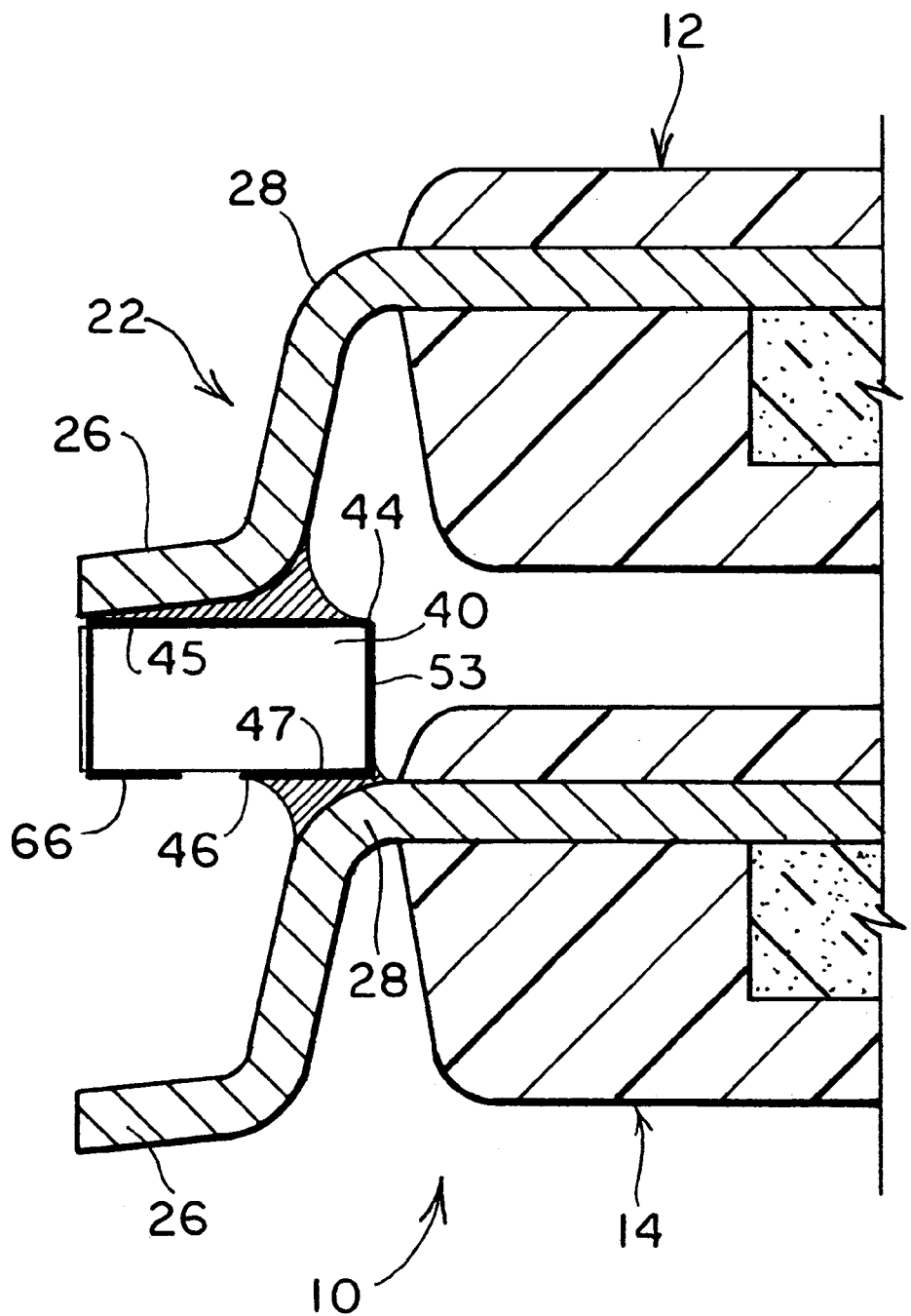
FIG. 10 depicts a sectional view of the connection structure along line A—A of FIG. 7.

FIG. 8 depicts a sectional view of the connection structure along line C—C of FIG. 7. As shown in FIG. 8, enablement trace terminus 68 is connected through upper connective 44 of carrier structure 40 to the foot 26 of a depicted enable lead of upper IC 12 of module 10. As shown in FIG. 8, although carrier structure 40 is disposed so as to place its lower surface 47 along the plane of heads 31 of leads 22 of lower IC 14, there is no connection to shown lead 22 of lower IC 14 and, at this site, lower surface 47 does not touch the lead 22 of the lower IC 14. Lower surface 47 may touch the lead 22 of lower IC 14, however, as long as, for this particular site depicting a preferred differential enablement strategy, connection 68 does not contact this particular lead 22 of lower IC 14. When created, module 10 will, as shown in FIG. 1, have spaced upper IC 12 from lower IC 14. The space between upper and lower ICs may be left open to air flow or may be filled with a thermally conductive element 72 positioned with thermally conductive adhesive shown at reference 70. The signal on enablement trace terminus 68 shown in FIG. 8 was conveyed through the body of enablement trace 65 shown in FIG. 9 which depicts FIG. 7 along line A—A. As shown, there is no connection between enablement trace 65 and either the upper or lower connective elements at this point in its transit from terminus 66 to terminus 68. FIG. 10 is a sectional view along the line B—B of FIG. 7 and shows enablement trace terminus 66 is connected through upper connective element 44 and upper to lower connective 53 and lower connective element 46 to shoulder 28 of lower IC 14 to receive an enable signal for upper IC 12 at a no-connect lead of lower IC 14.

Although the present invention has been described in detail, it will be apparent that those skilled in the art that the invention may be embodied in a variety of specific forms and that various changes, substitutions and alterations can be made without departing from the spirit and scope of the invention. The described embodiments are only illustrative and not restrictive and the scope of the invention is, therefore, indicated by the following claims.

We claim:

1. A circuit module comprised of:
   a first packaged integrated circuit and a second packaged integrated circuit, each of the first and second packaged integrated circuits having an upper surface, a lower surface and a peripheral wall, emergent from first and second sides of said peripheral wall are leads that each have a shoulder and foot, the shoulders each having a head;
   a first carrier structure having pairs of corresponding and electrically communicative upper and lower connective elements, the upper and lower connective elements being respectively disposed along first and second substantially planar surfaces of the first carrier structure, the upper connective elements being disposed beneath feet of selected leads emergent from the first side of the peripheral wall of the first packaged integrated circuit and the second substantially planar surface of the first carrier structure being disposed along the plane of the heads of selected leads emergent from the first side of the peripheral wall of the second packaged integrated circuit; and
   a second carrier structure having pairs of corresponding and electrically communicative upper and lower connective elements, the upper and lower connective elements being disposed along first and second substantially planar surfaces respectively of the second carrier structure, the upper connective elements being disposed beneath feet of selected leads emergent from the second side of the peripheral wall of the first packaged integrated circuit and the second substantially planar surface of the first carrier structure being disposed along the plane of the heads of selected leads emergent from the second side of the peripheral wall of the second packaged integrated circuit.

2. The circuit module of claim 1 in which the corresponding upper and lower connective elements electrically communicate through vias.

3. The circuit module of claim 2 in which the vias are disposed perpendicularly to the first and second substantially planar surfaces of the first and second carrier structures.

4. The circuit module of claim 3 in which the vias are on a surface of the first and second carrier structures.

5. The circuit module of claim 1 in which the corresponding upper and lower connective elements electrically communicate through a trace.

6. The circuit module of claim 1 in which the first and second carrier structures are comprised of printed circuit board.

7. The circuit module of claim 6 in which the printed circuit board has multiple layers.

8. The circuit module of claim 6 in which the printed circuit board is patterned to include an electrically communicative pathway between a no-connect lead of the second packaged integrated circuit and an active lead of the first packaged integrated circuit.

9. The circuit module of claim 1 in which the first and second carrier structures distance the first packaged integrated circuit from the second packaged integrated circuit and between the first and second carrier structures there resides a thermally conductive material.

10. The circuit module of claim 1 in which the first and second carrier structures distance the first packaged integrated circuit from the second packaged integrated circuit and the created gap there between is narrower than the distance from the upper and lower surfaces of the first packaged integrated circuit.

11. The circuit module of claim 1 in which the first and second packaged integrated circuits are TSOPs.

12. A circuit module having four peripheral sides, the module being comprised of:
    an upper integrated circuit and a lower integrated circuit, each integrated circuit having an upper surface, a lower surface, and a periphery emergent from which are a plurality of leads each having a shoulder and a foot;
    two carrier structures, each disposed on a peripheral side of the module between selected feet of the upper integrated circuit and selected shoulders of the lower integrated circuit to distance the upper integrated circuit above the lower integrated circuit, the carrier structures each having a set of electrical pathways, certain ones of said set of electrical pathways providing electrical communication between certain ones of the selected feet of the upper integrated circuit and certain corresponding ones of the selected shoulders of the lower integrated circuit.

13. The module of claim 12 in which the integrated circuits are TSOP packaged memory circuits.

14. The module of claim 12 in which the carrier structures are comprised of printed circuit board material.

15. The module of claim 12 in which thermally conductive material resides in the space between the upper and lower integrated circuits.

16. The module of claim 12 in which the space between the upper and lower integrated circuits is an air gap.

17. A circuit module in which more than two integrated circuits are stacked with carrier structures according to claim 12.

18. The module of claim 12 in which the two carrier structures are etched printed circuit board patterned to connect a no-connect one of the leads of the lower IC with an active lead of the upper IC.

19. The module of claim 12 in which the electrical pathways comprise a trace disposed on a surface of the carrier structures.

20. A method of creating a stack of integrated circuits selectively connected to provide increased memory density in an application;
    providing a printed circuit board having upper and lower connective surfaces;
    etching said printed circuit board to provide two rows each having a plurality of upper and a coincident plurality of lower connective elements;
    disposing connective vias between corresponding upper and lower connective elements for each row;
    creating openings on each side of each row of upper and coincident lower connective elements, a central opening being large enough to dispose therein an integrated circuit body;
    placing a first integrated circuit in a position to contact at a plurality of its shoulders, the lower connective elements of the printed circuit board rows;

soldering the first integrated circuit into connection with the lower connective elements of the rows of the printed circuit board;

placing a second integrated circuit into a position to contact at a plurality of its feet, the upper connective elements of the printed circuit board rows;

soldering the second integrated circuit to maintain the contact between the feet and upper connective elements;

separating the two rows from the printed circuit board.

21. The method of claim 20 in which the first integrated circuit is placed in position to contact the lower connective elements with a pick and place machine.

22. The method of claim 20 in which the printed circuit board is a multi-layer board.

23. The circuit module of claim 1 fabricated according to the method of claim 20.

24. An integrated circuit module fabricated according to the method of claim 20.

* * * * *